US007135717B2

(12) United States Patent
Mizutani

(10) Patent No.: US 7,135,717 B2
(45) Date of Patent: Nov. 14, 2006

(54) SEMICONDUCTOR SWITCHES AND SWITCHING CIRCUITS FOR MICROWAVE

(75) Inventor: Hiroshi Mizutani, Tokyo (JP)

(73) Assignee: Nec Electronics Corporation, Kanagawa (JP)

( * ) Notice: Subject to any disclaimer, the term of this patent is extended or adjusted under 35 U.S.C. 154(b) by 0 days.

(21) Appl. No.: 10/737,261

(22) Filed: Dec. 15, 2003

(65) Prior Publication Data

US 2005/0029542 A1   Feb. 10, 2005

Related U.S. Application Data

(63) Continuation of application No. 09/372,322, filed on Aug. 11, 1999, now abandoned.

(30) Foreign Application Priority Data

Aug. 12, 1998   (JP)   ............... 10-228311

(51) Int. Cl.
*H01L 31/0328* (2006.01)
(52) U.S. Cl. .............. 257/109; 257/151; 257/152; 257/153; 257/259; 257/662; 257/663; 333/101; 333/262
(58) Field of Classification Search .......... 257/109, 257/151–153, 259, 662–664; 330/53; 333/104, 333/101, 262
See application file for complete search history.

(56) References Cited

U.S. PATENT DOCUMENTS

| | | | |
|---|---|---|---|
| 3,975,690 A * | 8/1976 | Fleming | 330/5 |
| 4,322,695 A * | 3/1982 | Fleming et al. | 333/104 |
| 4,565,982 A * | 1/1986 | Stern et al. | 333/157 |
| 4,947,142 A * | 8/1990 | Tayrani | 333/81 A |
| 5,086,329 A * | 2/1992 | Newman | 257/482 |
| 5,825,240 A * | 10/1998 | Geis et al. | 327/570 |
| 5,945,700 A * | 8/1999 | Mizutani | 257/259 |

* cited by examiner

*Primary Examiner*—Eugene Lee
(74) *Attorney, Agent, or Firm*—Muirhead and Saturnelli, LLC

(57) ABSTRACT

The purpose of the present invention is to provide a small-sized switch attaining high isolation of not less than 80 dB, maintaining low insertion loss also in high frequencies not less than 60 GHz. A semiconductor switch according to the present invention utilizes FETs a gate electrode, a source electrode, and a drain electrode of each of which are formed on a semiconductor. The source electrode and the drain electrode are connected with the earth as well as are disposed in parallel to each other, and the gate electrode is formed between the source electrode and the drain electrode, and both the ends of the gate electrode are connected to the first input-output terminal 1 and the second input-output terminal.

10 Claims, 11 Drawing Sheets

FREQUENCY 200.0 GHz/DIV
M1 FREQUENCY = 76.0 VALUE = -1.70943043
M2 FREQUENCY = 76.0 VALUE = -81.2135624

FREQUENCY 60.0 GHz/DIV
M1 FREQUENCY = 110.0 VALUE = -1.73912687
M2 FREQUENCY = 110.0 VALUE = -82.0091230

SEMICONDUCTOR SWITCHES AND SWITCHING CIRCUITS FOR MICROWAVE

CROSS REFERENCE TO RELATED APPLICATIONS

This application is a continuation of U.S. patent application Ser. No. 09/372,322 filed Aug. 11, 1999 now abandoned.

BACKGROUND OF THE INVENTION

1. Field of the Invention

This invention relates to semiconductor switches, and in particular to semiconductor switches for microwave as well as millimeter wave bands using a transmission line comprising a dielectric substance substrate and metal conductors, and diodes or field effect transistors (FETs) showing distributed parameter effect.

2. Description of the Prior Art

As a semiconductor switching circuit which is contemplated for use in microwave as well as millimeter wave bands, in particular with high frequencies not less than 60 GHz, various kinds of circuits have been proposed and manufactured for trial.

Single-pole 3-throw (SP3T) switches for the 77 GHz band (hereinafter to be referred to as Conventional example 1) were reported by M. Case et al. in "1997 MTT-S IMS Digest pp. 1047–1050" and can be nominated as an example of conventional switches.

An SP3T switch of Conventional example 1 comprises configuration as shown in FIG. 12. An input terminal 20 is connected with a signal junction N via a transmission line 21. One end of each transmission line 22–24 having length of a quarter of propagating wave length (a quarter wave length transmission line) is connected via capacitance C1, C2, and C3 for DC cutting respectively to each signal junction. The other end of each of a quarter wave length transmission lines 22–24 is connected respectively to one end of PIN diode D1, D2, or D3 as well as to the first, the second, or third output terminal 25–27. The other end of each PIN diode D1, D2, or D3 is connected with the earth. Capacitance C1, C2, and C3 for DC cutting, a quarter wave length transmission lines 22–24, diodes D1, D2, and D3, and the first, the second, and the third output terminals 25–27 form three output signal passes.

A diode can be expressed as a resistance for equivalent circuit thereof when the diode is biased forward, and can be expressed as a capacitance for equivalent circuit thereof when the diode is biased in the reverse direction. Accordingly, when a diode is biased forward, there exists little impedance, and the anode and cathode thereof may be regarded to be short-circuited. In addition, the impedance for frequencies in correspondence with propagating wave length when this diode is seen via a quarter wave length transmission line is close to infinite, and thus may be regarded as almost open. That is, a signal pass where a diode is biased forward will be seen as almost open from the signal junction, and as a consequence, an RF signal having propagated the signal pass will be almost totally reflected. On the other hand, since a diode which is biased in the reverse direction functions as a capacitance, the impedance will get high for low frequencies, and accordingly a signal pass where a diode is biased in the reverse direction is transparent. As the frequency gets higher, the impedance of a capacitance gets lower, and therefore, signal reflection at a signal junction will increase. As a result, a signal pass where a diode is biased in the reverse direction allows signals to travel transparently, but on the other hand, an increase in frequency will result in an increase in loss due to reflection.

Thus, in switches of Conventional example 1, among the three output signal passes, the signal pass to make signals travel transparently comprises a diode, which is biased in the reverse direction, and on the other hand, the other remaining signal passes comprise diodes, which are biased forward, to cut off signals on the other remaining signal passes, which will enable to switch the signal passes.

Insertion loss as well as isolation in a single-pole single-throw (SPST) of Conventional example 1 as described above can for the purpose of simplicity be supposed that characteristic impedance of the transmission line equals impedance of the input-output terminals, and then can be expressed as the equation (1) and the equation (2).

$$IL = \frac{4}{4 + \omega^2 C^2 Z_0^2} \quad (1)$$

$$I_{SO} = \frac{4}{\left(2 + \frac{Z_0}{R}\right)} \quad (2)$$

As apparent from the equation (2), isolation is expressed with the resistance R and the impedance $Z_0$ of the input-output terminals, but does not depend on frequencies. In switches of Conventional example 1, however, when isolation of, for example, not less than 40 dB is to be attained, the resistance values of diode will have to be not more than 0.13 $\Omega$. Here, in the disclosed document of Conventional example 1, the resistance value of the diode is described as 3 $\Omega$. Accordingly, in switches of Conventional example 1, for the purpose of realizing a resistance value of 0.13 $\Omega$, the anode electrode area to be multiplied approximately by 23 will do. However, the anode electrode area being 23 times as much means that the capacitance value will simultaneously be 23 times as much as well. As a result, since the capacitance value of the diode disclosed in the document is 33 fF, the capacitance to attain isolation of 40 dB will be 759 fF which is 23 times as much. Based on this, with reference to the equation (1), insertion loss for a capacitance of 33 fF ($=33 \times 10^{-15}$ F) is 0.6 dB, while insertion loss reaches as much as 19 dB when the anode electrode area is made 23 times as much. That is, in switching circuit of the above-described Conventional example 1, insertion loss and isolation are in a trade-off relationship, and high isolation characteristics such as 40 dB were not attainable.

In addition, single-pole single-throw (SPST) switches for the 94 GHz band (hereinafter to be referred to as Conventional example 2) were reported by H. Takasu et al. in "IEEE MICROWAVE AND GUIDED LETTERS, Vol. 6, pp. 315–316" and can be nominated, conventionally, as an example of another switch. This switch of Conventional example 2 is also one of possible circuits as switching circuits for high frequency bands not less than 60 GHz.

An SPST switch of Conventional example 2 comprises configuration as shown in FIG. 13. An SPST switch of Conventional example 2 comprises a field effect transistor (FET), an inductor, and a resistance. The input-output terminals 31, 32 are respectively connected with the source and drain of an FET, between which an inductor L configured with a microstrip line pass is connected in parallel. To the gate of FET, a resistance R of 2.5 k$\Omega$ is connected, and via the resistance a direct current bias is arranged to be applied to the gate. In the state that the channel of FET is closed, the FET can be treated equivalently as a capacitance C, which, therefore, as shown in FIG. 14, together with the inductance L connected with the FET in parallel, resonance takes place at a frequency obtainable from the equation (3), and as a consequence, resulting in high impedance so that signal propagation between the input-output terminals will be cut off. That is, the switch enters the off state.

$$f = \frac{1}{2\pi\sqrt{LC}} \quad (3)$$

FIG. 15 shows frequency characteristics on insertion loss as well as isolation in the switch of Conventional example 2. As obvious from FIG. 15, in the switching circuit of Conventional example 2, isolation characteristics around 30 dB are attainable with comparatively low insertion loss. However, since, as described before, the switching circuit of Conventional example 2 makes use of resonance, its frequency characteristics will fall in narrow band width. Moreover, for the purpose of making a resonance circuit start resonance at a desired frequency, it is necessary to accurately know LC being a constant of the circuit. Accordingly, for the purpose of using a switch of Conventional example 2, not only the capacitance C to appear at closure of the FET channel will have to be accurately estimated, but also as concerns the inductor L accurate modeling will become necessary. On the contrary, FETs as well as PIN diodes, etc., normally have variation of forming process to a certain extent, but for example, due to this variation, the value of capacitance C could deviate from the design, and as a result the resonance frequency will deviate from the design as well, and resonance will not be available at a desired frequency, which, as a consequence, will give rise to reduction of yield.

Switching circuits (hereinafter to be referred to as Conventional example 3) were conventionally proposed by H. Mizutani and Y. Takayama in "1997 MTT-S IMS Digest pp. 439–442" and can be nominated as technology to solve the problems with the aforementioned Conventional example 1 as well as Conventional example 2. The switching circuit of Conventional example 3 is a switching circuit utilizing an FET showing distributed parameter effect, and its wide band width characteristics were proved in the document. Incidentally, the contents of the document has been disclosed in Japanese Patent Laid-Open No. 10-41404 specification as well.

A switching circuit of Conventional example 3 comprises the configuration as shown in FIG. 16. As understandable with reference to FIG. 16, the switching circuit of Conventional example 3 comprises plural transmission lines and plural FETs. For the switching circuit of Conventional example 3 in detail, each transmission line as well as each FET is respectively defined per micro unit length, and transmission lines are connected in series, and the drain of each FET is connected to the respective junction of them. Incidentally, the source of each FET is connected with the earth. The configuration is made in an infinite connection of these transmission line as well as FET per micro unit length.

Such switching circuit of Conventional example 3 is implemented as a plane surface pattern, where each FET (hereinafter to be referred to as distributed parameter FET) comprises a source connected with the earth, a gate finger with a length of 400 μm, and a drain electrode, both longitudinal ends of which have been connected with the input-output terminals.

A switching circuit of Conventional example 3 comprising such a configuration acts equivalently as a transmission line without any loss as shown in FIG. 17 in the state that the channel of FET is closed. As apparent from FIG. 17, the switch enters the ON state, and insertion loss is expressed by the equation (4) through the equation (6).

$$S_{21}^{ON} = \frac{2ZZ_0}{2ZZ_0\cos\beta 1 + j(Z^2 + Z_0^2)\sin\beta 1} \quad (4)$$

$$\beta = \omega\sqrt{(L(C_{IL} + C_{FET})} \quad (5)$$

$$Z = \sqrt{\frac{L}{(C_{IL} + C_{FET})}} \quad (6)$$

Here, "Z" represents impedance of the switch, "1" represents length of a finger of an FET, $Z_0$ represents impedance of the input-output terminal. In addition, "ω" represents angular frequency, and L, R, C, and G respectively represent inductance, resistance, parallel capacitance, parallel conductance per unit length of the switch.

On the other hand, an FET is equivalently expressed as a mere resistance in the state where its channel is open, thus, the equivalent circuit on the switch at that time will be as shown in FIG. 18. As understandable with reference to FIG. 18, a switching circuit of Conventional example 3 acts equivalently as a transmission line with loss in the state that the channel of FET is open, that is, the switch enters the OFF state, and its isolation can be expressed by the equation (7) through the equation (9).

$$S_{21}^{ON} = \frac{2ZZ_0}{2ZZ_0\cosh\psi + (Z^2 + Z_0^2)\sinh\psi} \quad (7)$$

$$\gamma \equiv \alpha + j\beta \equiv \sqrt{j\omega L(j\omega C_{IL} + G)} \quad (8)$$

$$Z = \sqrt{\frac{j\omega L}{j\omega C_{IL} + G}} \quad (9)$$

From these equations, in a wide band as shown in FIG. 19, low insertion loss and high isolation are obtainable. As understandable from FIG. 19, frequency characteristics of isolation in the switching circuit of Conventional example 3 are in gradual increase.

However, not only in switching circuits of the above-described Conventional example 1 as well as Conventional example 2 without doubt, but also in switching circuit of Conventional example 3 it was practically difficult to maintain low insertion loss and realize high isolation in a wide band as a comparatively compact type. This point is explained in detail as follows.

In a switch according to Conventional example 3, the $0^{th}$ digit term concerning the frequency of isolation is expressed by the equation (10).

$$IL_{DC} = \left(\frac{2}{2 + \frac{Z_0}{r}}\right)^2 \quad (10)$$

As understandable from the equation (10), as resistance "r" of distributed parameter FET gets smaller, isolation gets greater. Incidentally, in the switching circuit using a distributed parameter FET, the $0^{th}$ digit close resemblance on the isolation frequency corresponds with the isolation of the switching circuit with shunt configuration using a lumped constant FET expressed in the aforementioned equation (2).

Accordingly, for the purpose of attaining high isolation in the switching circuit of Conventional example 3, the gate finger length must be lengthened so that the resistance "r" of distributed parameter FET be reduced. In particular, for the purpose of attaining high isolation of not less than 80 dB in the switching circuit of Conventional example 3, the gate finger length must be lengthened to, for example, 1 mm so that the resistance "r" of distributed parameter FET be reduced. To extend the gate finger length like this means the chip size of microwave or millimeter wave single integrated circuit (MMIC) will get bigger.

As understandable from these features, in microwave or millimeter wave band switching circuits there was a problem that it was difficult for the prior art to realize high isolation of not less than 80 dB covering a wide band width with a comparatively small type configuration, while maintaining low insertion loss. This was originated in circuit configurations in the respective prior arts, such as, existence respectively of the trade-off relationship between insertion loss and isolation, narrow band width characteristics due to usage of resonance, or the trade-off relationship between resistance of distributed parameter FET and the chip size.

BRIEF SUMMARY OF THE INVENTION

Object of the Invention

The present invention was made contemplating on those problems presented by these prior arts, and in particular the purpose thereof is to provide small-sized switching circuits for microwave or millimeter wave band which can attain high isolation of not less than 80 dB covering a wide band width with a low loss, which the prior arts were hardly successful in realizing in high frequencies not less than 60 GHz.

Summary of the Invention

The present invention provides semiconductor switches and switching circuits shown as, follows as means for solving the above-described problems.

Operation of semiconductor switches and switching circuits of the present invention comprising such configuration can be explained as follows by exemplifying a first semiconductor switch as well as a third semiconductor switch for example.

The first semiconductor switch as well as the third switch circuit according to the present invention functions as a coplanar line without any loss under the ON state, and functions as a coplanar line with loss under the OFF state. On such points, these switches are similar to those switching circuits of Conventional example 3. Accordingly, the insertion loss of switches according to the present invention is expressed by the aforementioned equations (4) through (6), and likewise isolation is expressed by the equations (7) through (9). Moreover, in the switches according to the present invention, isolation gradually increases on frequency.

As described above, in the switching circuit functioning as a coplanar line without loss and with loss respectively in the ON state and in the OFF state, the $0^{th}$ digit close resemblance on the isolation frequency is expressed by the equation (10). In addition, as being understood from this equation, larger isolation may be obtained by reducing the resistance "r", which is as mentioned before.

Qualitatively, with a constant sheet resistance value, wider width of an element reduces the resistance value, and longer length of an element increases the resistance value, which is generally known.

Here, with the width of an FET being constant, comparison between the switching circuits of Conventional example 3 and semiconductor switches and switching circuits according to the present invention leads to the following understanding. That is, the resistance value of the distributed parameter FET in Conventional example 3 is already defined by the source-drain distance. On the contrary, the resistance values of the resistance defining isolation in the switches according to the present invention depend on the gate-source, and the gate-drain distances. In detail, a switch according to the present invention comprises such a configuration that the source, the gate, and the drain of a so-called Schottky barrier FET are enclosed by an active layer, and the source as well as the drain is connected with the earth. Thus, when forward bias voltage which is to determine the current value to flow to the gate by the source-drain resistance is supplied as gate voltage to between the gate and source as well as between the gate and the drain, the resistance which determines the isolation in the switches of the present invention is understood to be the source resistance between the gate and the source or the drain resistance between the gate and the drain of Schottky barrier diode. That is, unlike Conventional example 3, in the switches according to the present invention, the resistance value to determine isolation is determined by distances between gate and source as well as between gate and drain. This leads to understanding that the resistance value of the resistance to determine isolation in the switches of the present invention is simply considered to be decreased to approximately a half of that of Conventional example 3 since the gate electrode of an FET to be used for switches is disposed in general in the middle between the source and the drain. Incidentally, for easier understanding, the contact resistance is set to be constant. As understandable from the foregoing, the semiconductor switches according to the present invention can realize compactness as well as lower loss, and high isolation when compared with not only Conventional examples 1 and 2 but also Conventional example 3.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
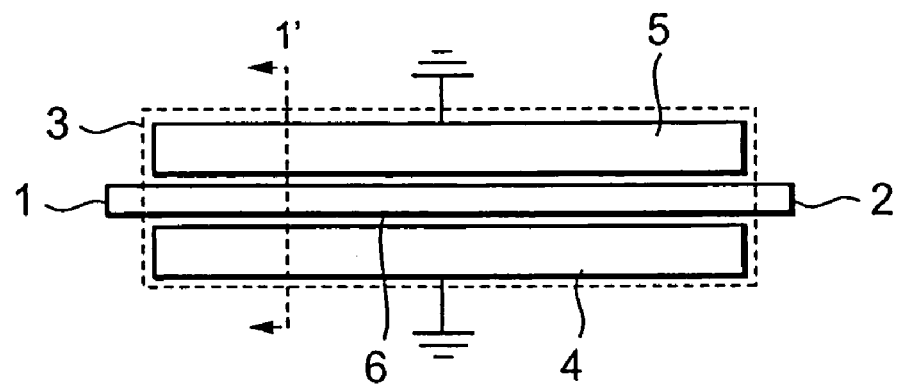
FIG. 1A is a plan view showing a semiconductor switch according to a first embodiment of the present invention and FIG. 1B is a cross sectional view taking along a line 1' of FIG. 1A.
Figure 1B:
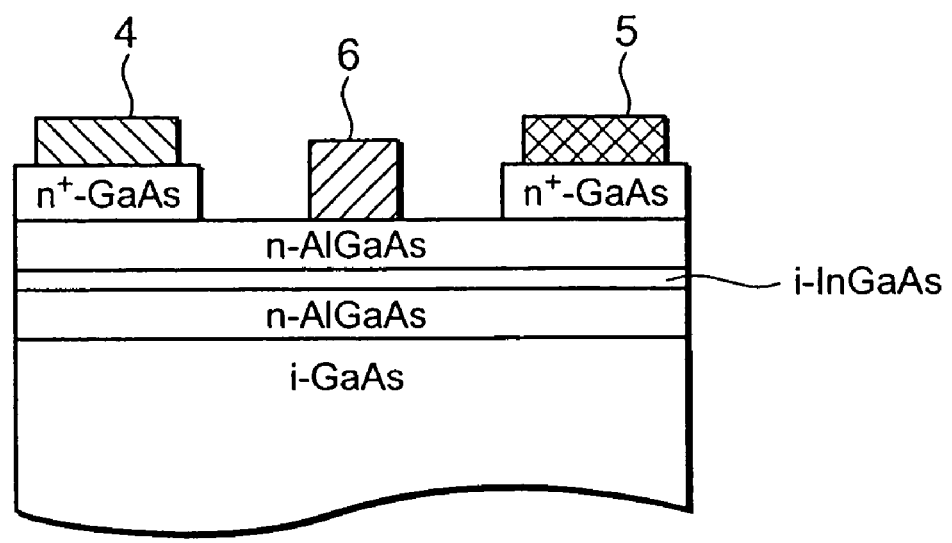
Figure 2:
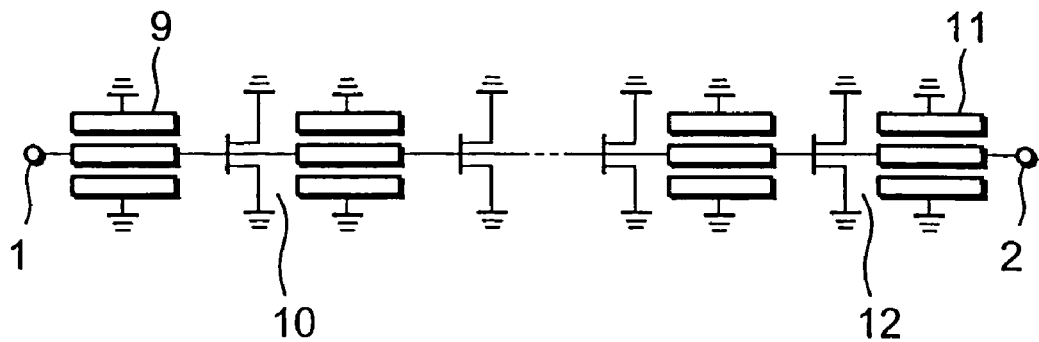
FIG. 2 is a circuit diagram showing a switching circuit equivalent to the semiconductor switch according to the first embodiment of the present invention.

The semiconductor switch according to a first embodiment of the present invention comprises the configuration as shown in FIGS. 1A and 1B, and the switching circuit according to the first embodiment of the present invention comprises the configuration as shown in FIG. 2.

With reference to FIG. 1, the semiconductor switch according to the present embodiment comprises the source electrode 4, drain electrode 5, and the gate electrode 6 which are enclosed by an active layer 3. These electrodes are disposed in parallel to each other in a predetermined direction on the semiconductor substrate (in this example, in the right-left lateral direction on the paper surface). The source electrode 4 and the drain electrode 5 are respectively connected with the earth, and the gate electrode 6 is disposed in between these source electrode 4 and drain electrode 5. Both the ends of the gate electrode 6 in the predetermined direction operate respectively as the first and the second input-output units, and are connected to the first input-output terminal 1 and the second input-output terminal 2.

Circuit-wise, as shown in FIG. 2, this configuration is equivalent to a switching circuit comprising the coplanar lines and field effect transistors, wherein the first input-output terminal 1 is connected with one end of the signal line of the first coplanar line 9, and the gate of the first field effect transistor 10 is connected with the other end of the signal line of the first coplanar line 9, and the second input-output terminal 2 is connected with one end of the signal line of the second coplanar line 11, and the gate of the second field effect transistor 12 is connected with the other end of the signal line of the second coplanar line 11, and further, to and between the first field effect transistor 10 and the second field effect transistor 12 plural coplanar lines and plural field effect transistors are alternately connected in series. Incidentally, in the present embodiment, each coplanar line comprises such a configuration that the signal line is sandwiched by a grounded conductor, and each field effect transistor is a distributed parameter FET, and its source as well as its drain is connected with the earth. Thus configured semiconductor switches and switching circuits are mounted as a plane pattern where in the distributed parameter FET the source electrode as well as the drain electrode of which is connected with the earth the input-output terminal has been connected with both the ends of the gate electrode disposed in the longitudinal direction, and also can be easily formed by connecting the source-drain electrodes of MESFET (metal-semiconductor field-effect transistor) with the earth.

The semiconductor switch and the switching circuits comprising such configurations are arranged so that positive voltage as well as zero bias is applied to the gate electrode 6 outside the active layer 3 by a not-shown bias line via a resistance. At this time, when required, capacitance C1, C2, and C3 for DC cutting is inserted between the gate electrode 6 and each input-output terminal.

When positive voltage is applied to the gate electrode 6, and a current flows into the gate electrode, forward bias is to be given to between the gate and the source as well as between the gate and the drain, which can be regarded as short-circuited. At this time, a gate-source line as well as a gate-drain line can respectively be equivalently expressed as a resistance, and accordingly, an equivalent circuit of the switch will be a coplanar line with loss in shunt due to conductance. That is, the switch enters the OFF state. The isolation characteristics under this state can be calculated by the aforementioned equations (7) through (9), using the conductance G of shunt.

On the other hand, in the case where zero bias is supplied to the gate electrode 6, lines between the gate and the source as well as between the gate and the drain can be regarded as open, and their equivalent circuits can be expressed in capacitance. At this time, the switch is equivalently the same as circuit configuration of a coplanar line without loss, and enters the ON state.

Here, the semiconductor switch and the switching circuits according to the present embodiment are partly characterized by low characteristic impedance of the coplanar line due to shunt capacitance between the gate and the source as well as between the gate and the drain. Accordingly, mismatching between characteristic impedance and impedance of the input-output terminal will give rise to reflection, and that reflection will give rise to insertion loss. This insertion loss can be calculated by the aforementioned equations (4) through (6). With the semiconductor switch and the switching circuits according to the present embodiment, switching between the ON state and the OFF state can be conducted by a positive electric power, which is additional characteristics.

For the purpose of cultivating better understanding on the present embodiment, an example of the semiconductor switch and the switching circuits will be introduced hereunder, and explained in detail with reference to the drawings.

In the present example, a heterojunction FET of AlGaAs and InGaAs systems was used as the FET in the above-described first embodiment. In detail, referring to FIG. 1B, a n-AlGaAs layer is formed on an i-GaAs layer. An i-InGaAs layer as a channel layer is formed on the n-AlGaAs layer. A n-AlGaAs layer is formed on the i-InGaAs layer. 2 $n^+$-GaAs layers are formed on the n-AlGaAs layer apart from each other. The gate electrode 6 is formed on the n-AlGaAs layer between the $n^+$-GaAs layers. The gate electrode 6 is made by aluminum, gold, molybdenum, titanium, or tungsten silicide. The source electrode 4 is formed on one of the $n^+$-GaAs layer. The drain electrode 5 is formed on the other of the $n^+$-GaAs layer. The source and drain electrodes are made by an alloy including AuGe or nickel. In addition, the area of the gate electrode 6 was set to 2×400 μm, and the distances between the gate electrode 6 and the source electrode 4 or the drain electrode 5 were set to 2.5 μm. Moreover, the first input-output terminal 1 and the second input-output terminal 2 are respectively connected with both the ends of the gate electrode 6, and further, 50 Ω loads are respectively connected with the first input-output terminal 1 and the second input-output terminal 2. Incidentally, capacitance with zero bias between the gate and the source and between the gate and the drain is 20 fF per 100 μm, and on the other hand, resistance with forward bias is 3.3 Ω per 100 μm. In addition, entire length of the coplanar line is 400 μm.

In the semiconductor switch according to the present example comprising such configuration, 2 V and 0 V are applied to the gate so as to alternate the ON and OFF states. The principle of its operation is as described before.

Figure 3:
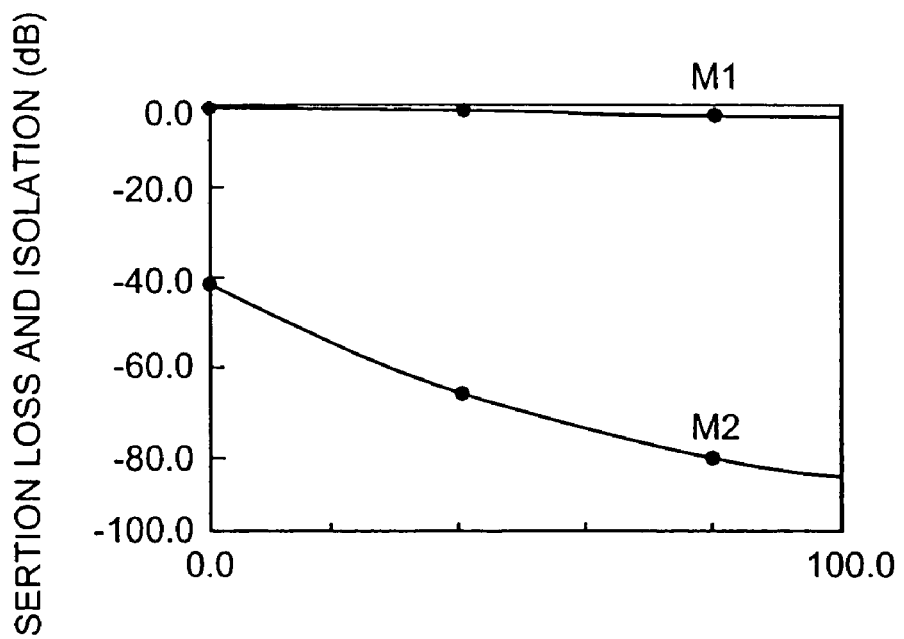
FIG. 3 is a graph showing frequency characteristics on insertion loss as well as isolation of the semiconductor switch according to an example in correspondence with the first embodiment of the present invention.

Frequency characteristics on insertion loss as well as isolation of the semiconductor switch according to the present example are shown in FIG. 3. As understandable with reference to FIG. 3, both show wide band width characteristics, and insertion loss at 76.0 GHz is 1.7 dB, and isolation is 81 dB. That is, the semiconductor switch according to the present example is the one which has realized high isolation of not less than 80 dB, maintaining low insertion loss, which was conventionally hardly successful in realizing in high frequencies not less than 60 GHz. Such effects become obtainable since, as mentioned before, in the switch in the OFF state conductance of shunt is twice as much as that in switching circuits according to the prior arts, that is, resistance is reduced by half. Incidentally, it goes without saying that the switch according to the present example features its operability only by positive electric power as described above.

Figure 4A:
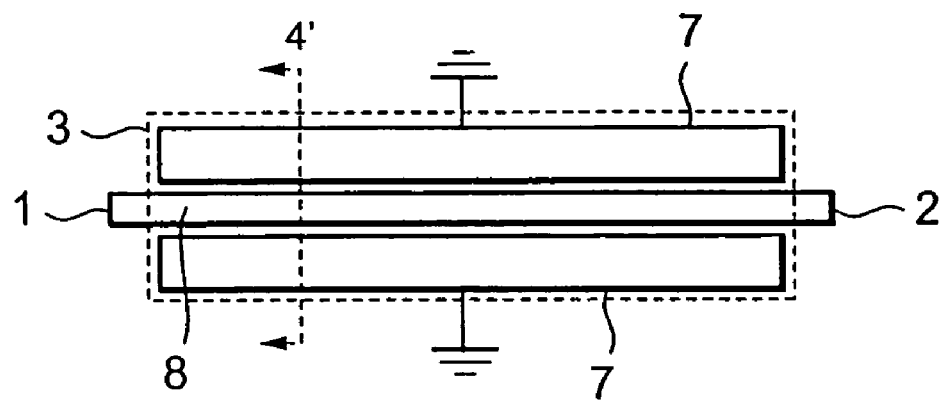
FIG. 4A is a plan view showing the semiconductor switch according to a second embodiment of the present invention and FIG. 4B is a cross sectional view takng along a line 4' of FIG. 4A.
Figure 4B:
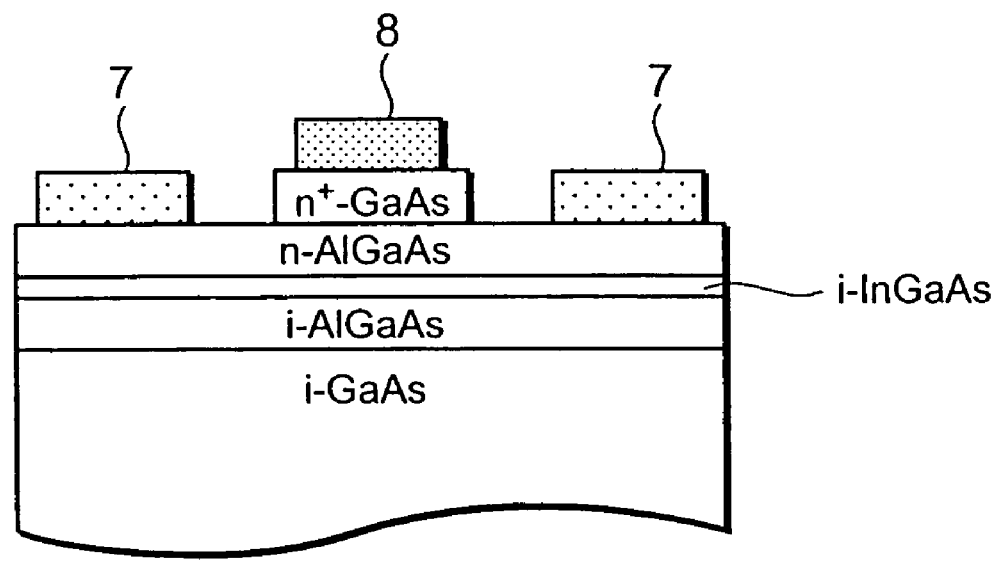
Figure 5:
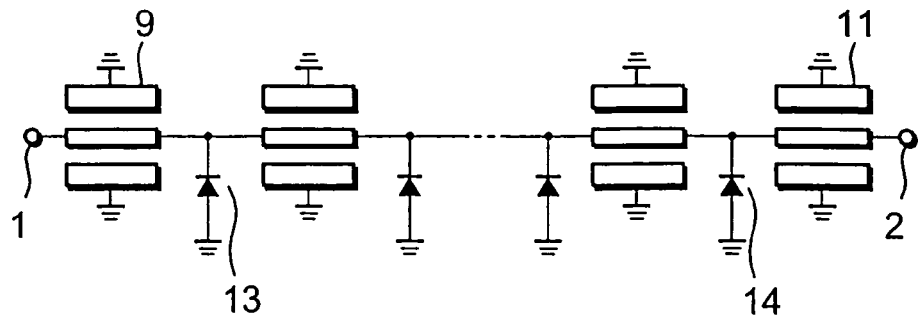
FIG. 5 is a circuit diagram showing the switching circuit equivalent to the semiconductor switch according to the second embodiment of the present invention.

The semiconductor switch according to a second embodiment of the present invention comprises the configuration as shown in FIGS. 4A and 4B, and the switching circuit according to the second embodiment of the present invention comprises the configuration as shown in FIG. 5.

With reference to FIG. 4A, the semiconductor switch according to the present embodiment comprises the two anode electrodes 7, and the cathode electrode 8 which are enclosed by an active layer 3. From two anode electrodes 7, one together with the cathode electrode 8 forms a Schottky barrier diode. In detail, referring to FIG. 4B, an i-AlGaAs layer is formed on an i-GaAs layer. An i-InGaAs layer as a channel layer is formed on the i-AlGaAs layer. A n-AlGaAs layer is formed on the i-InGaAs layer. The anode electrodes 7 are formed on the n-AlGaAs layer apart from each other. The cathode electrode 8 is formed on the n-AlGaAs layer through a $n^+$-GaAs layers. The anode electrode 7 are made by aluminum, gold, molybdenum, titanium, or tungsten silicide. The cathode electrode is made by an alloy including AuGe or nickel. In addition, the other anode electrode 7, likewise, together with the cathode electrode 8 may be considered to form a Schottky barrier diode, or may be considered to be an additional electrode established as an annex to the Schottky barrier diode. Anyway the two anode electrodes 7 are both connected with the earth, and are disposed in parallel to each other in a predetermined direction on the semiconductor substrate (in this example, in the right-left lateral direction on the paper surface). In addition, the cathode electrode 8 is disposed so as to be sandwiched between the two anode electrodes 7 as well as, likewise, to be in parallel to each other in a predetermined direction on the semiconductor substrate. The anode electrodes 7 have undergone Schottky junction with semiconductor crystal, and the cathode electrode 8 has undergone ohmic junction with semiconductor crystal. Both the ends of the cathode electrode 8 in the predetermined direction operate respectively as the first input-output unit and the second input-output unit, and are respectively connected with the first input-output terminal 1 and the second input-output terminal 2. Such semiconductor switches are driven by supplying the cathode electrode 8 with negative voltage as well as zero bias outside the active layer 3 by a not-shown bias line via a resistance. At this time, when required, capacitance C1, C2, and C3 for DC cutting is inserted between the cathode electrode 8 and each input-output terminal.

Circuit-wise, as shown in FIG. 5, this configuration is equivalent to a switching circuit comprising the coplanar lines and diodes, wherein the first input-output terminal 1 is connected with one end of the signal line of the first coplanar line 9, and the cathode of the first diode 13 is connected with the other end of the signal line of the first coplanar line 9, and the second input-output terminal 2 is connected with one end of the signal line of the second coplanar line 11, and the cathode of the second diode 14 is connected with the other end of the signal line of the second coplanar line 11, and further, to and between the first diode 13 and the second diode 14 plural coplanar lines and plural diodes are alternately connected in series. Incidentally, in the present embodiment, each coplanar line comprises such a configuration that the signal line is sandwiched by the grounded conductor, and each diode is a distributed parameter diode, and its anode is connected with the earth.

For the purpose of cultivating a better understanding on the present embodiment, an example of the semiconductor switch and the switching circuits will be introduced hereunder, and explained in detail with reference to the drawings.

In the present example, the area of the cathode electrode 8 was set to 5×400 μm, and the distance between the cathode electrode 8 and the anode electrode 7 was set to 3 μm. In addition, the first input-output terminal 1 and the second input-output terminal 2 are respectively connected with both the ends of the cathode electrode 8, and further, 50 Ω loads are respectively connected with the first input-output terminal 1 and the second input-output terminal 2. Incidentally, capacitance with zero bias between the cathode and the anode is 20 fF per 100 μm, and on the other hand, resistance with forward bias is 4 Ω per 100 μm. In addition, entire length of the coplanar line is 400 μm.

In the semiconductor switch according to the present example comprising such configuration, negative voltage (−2 V for the present example), and zero bias are supplied to the cathode so as to alternate the states of the switch. That is, when negative voltage is applied to the cathode of the semiconductor switch according to the present example, forward bias is to be given to the diode, an equivalent circuit of which is expressed by resistance, thus the switch can be regarded as a coplanar line with loss in shunt due to conductance. That is, at this time, the switch enters the OFF state. On the other hand, when zero bias was supplied to the cathode of the semiconductor switch according to the present example, an equivalent circuit of the diode is expressed by capacitance, thus the switch is equivalent to a coplanar line without loss. Accordingly, the switch enters the ON state.

Figure 6:
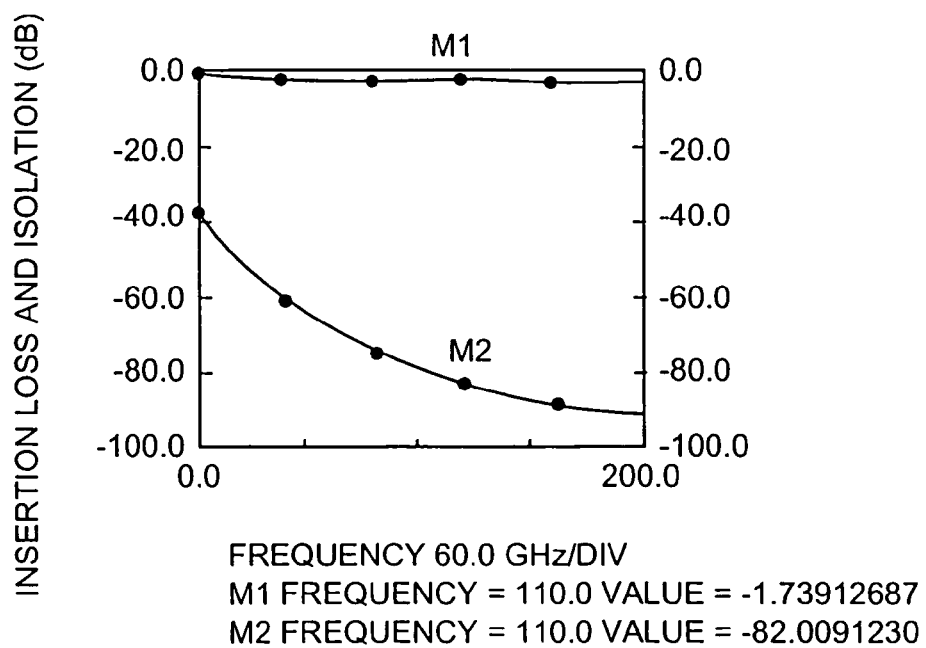
FIG. 6 is a graph showing frequency characteristics on insertion loss as well as isolation of the semiconductor switch according to an example in correspondence with the second embodiment of the present invention, which is controlled by using only negative electric power.

Frequency characteristics on insertion loss as well as isolation of the semiconductor switch according to the present example are shown in FIG. 6. As understandable with reference to FIG. 6, both show wide band width characteristics, and insertion loss at 110.0 GHz is 1.7 dB, and isolation is 82 dB. That is, it can be easily understood that the semiconductor switch according to the present example is the one which has realized high isolation of not less than 80 dB, maintaining low insertion loss, which was conventionally hardly successful in realizing in high frequencies not less than 60 GHz.

Here, both of positive and negative electric power should be applicable to the cathode. In this case, the diode is to be biased in the opposite direction when the positive voltage is 5 V, its capacity will decrease compared with that at the time of zero bias. In addition, at this time the switch is in the ON state, but the impedance of the switch approaches 50 Ω and thus insertion loss gets lowered.

Figure 7:
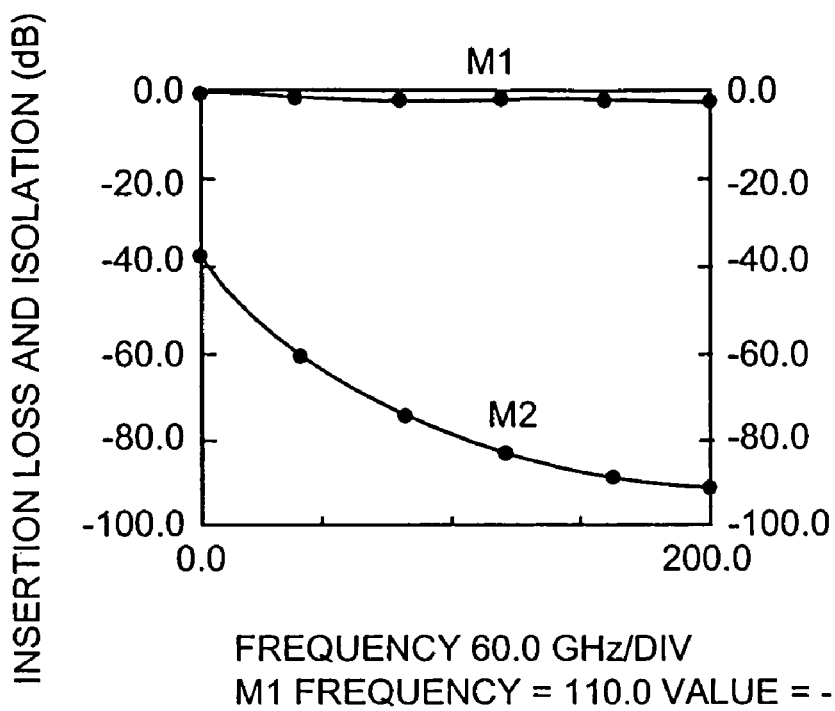
FIG. 7 is a graph showing frequency characteristics on insertion loss as well as isolation of the semiconductor switch according to an example in correspondence with the second embodiment of the present invention, which was controlled by using both positive and negative electric power.

Frequency characteristics on insertion loss as well as isolation of the semiconductor switch according to the present example in this case are shown in FIG. 7. As obvious with reference to FIG. 7, compared with the time of zero bias, insertion loss is reduced to 1.5 dB at 110.0 GHz. Incidentally, as obvious from the aforementioned equations (7) through (9), isolation, which does not depend on capacitance of diodes, is 82 dB, which remains same as in the time of zero bias without any changes to occur.

Figure 8A:
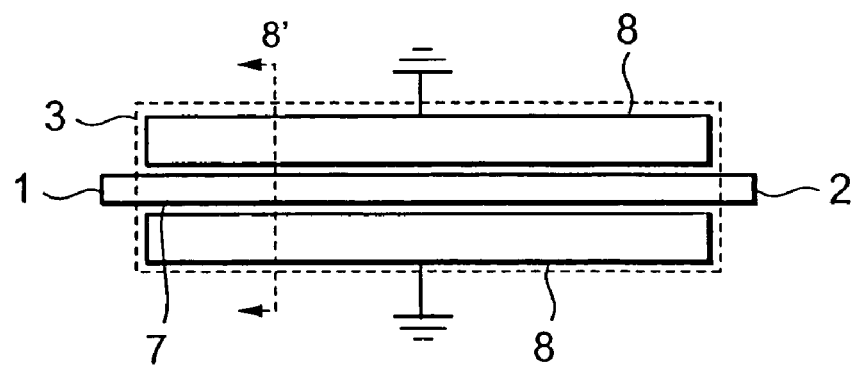
FIG. 8A is a plan view showing the semiconductor switch according to a third embodiment of the present invention and FIG. 8B is a cross sectional view taking along a line 8' of FIG. 8A.
Figure 8B:
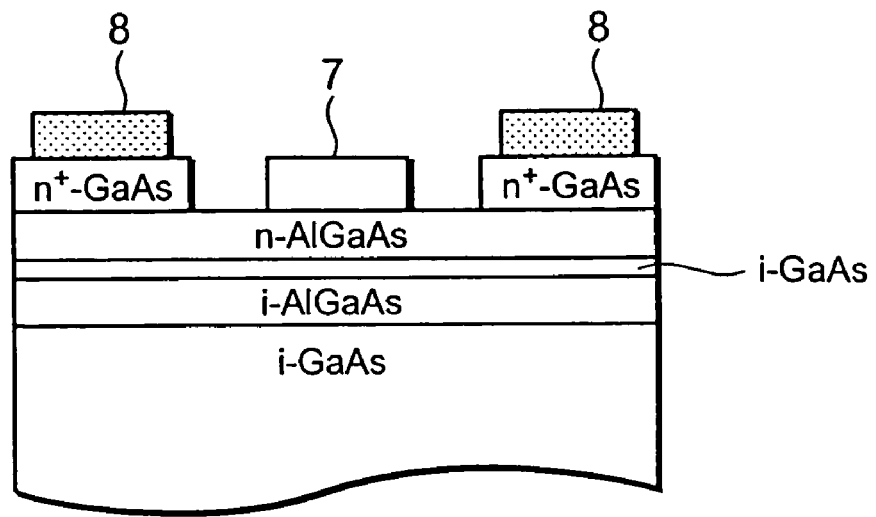
Figure 9:
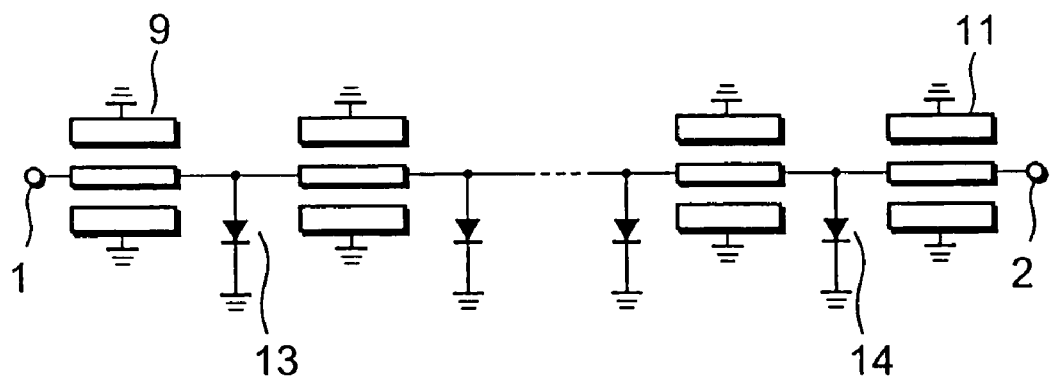
FIG. 9 is a circuit diagram showing the switching circuit equivalent to the semiconductor switch according to the third embodiment of the present invention.

The semiconductor switch according to a third embodiment of the present invention comprises the configuration as shown in FIGS. 8A and 8B, and the switching circuit according to the third embodiment of the present invention comprises the configuration as shown in FIG. 9.

With reference to FIG. 8, the semiconductor switch according to the present embodiment comprises two cathode electrodes 8, and the anode electrode 7 which are enclosed by an active layer 3. From two cathode electrodes 8, one together with the anode electrode 7 form a Schottky barrier diode. In addition, the other cathode electrode 8, likewise, together with the anode electrode 7 may be considered to form a Schottky barrier diode, or may be considered to be an additional electrode established as an annex to the Schottky barrier diode. Anyway the two cathode electrodes 8 are both connected with the earth, and are disposed in parallel to each other in a predetermined direction on the semiconductor substrate (in this example, in the right-left lateral direction on the paper surface). In addition, the anode electrode 7 is disposed so as to be sandwiched between the two cathode electrodes 8 as well as, likewise, to be in parallel to each other in a predetermined direction on the semiconductor substrate. The anode electrode 7 has undergone Schottky junction with semiconductor crystal, and the cathode electrodes 8 have undergone ohmic junction with semiconductor crystal. In detail, referring to FIG. 8B, an i-AlGaAs layer is formed on an i-GaAs layer. An i-InGaAs layer as a channel layer is formed on the i-AlGaAs layer. A n-AlGaAs layer is formed on the i-InGaAs layer. The cathodelectrodes 8 are formed on the n-AlGaAs layer apart from each other through the respective n$^+$-GaAs layer. The anode electrode 7 is formed on the n-AlGaAs layer. The anode electrode 7 is made by aluminum, gold, molybdenum, titanium, or tungsten silicide. The cathodelectrodes 8 are made by an alloy including AuGe or nickel. Both the ends of the anode electrode 7 in the predetermined direction operate respectively as the first input-output unit and the second input-output unit, and are respectively connected with the first input-output terminal 1 and the second input-output terminal 2. Such semiconductor switches are driven by supplying the anode electrode 7 with positive voltage as well as zero bias outside the active layer 3 by a not-shown bias line via a resistance.

Circuit-wise, as shown in FIG. 9, this configuration is equivalent to a switching circuit comprising the coplanar lines and diodes, wherein the first input-output terminal 1 is connected with one end of the signal line of the first coplanar line 9, and the anode of the first diode 13 is connected with the other end of the signal line of the first coplanar line 9, and the second input-output terminal 2 is connected with one end of the signal line of the second coplanar line 11, and the anode of the second diode 14 is connected with the other end of the signal line of the second coplanar line 11, and further, to and between the first diode 13 and the second diode 14 plural coplanar lines and plural diodes are alternately connected in series. Incidentally, in the present embodiment, each coplanar line comprises the configuration that the signal line is sandwiched by conductor connected with the earth, and each diode is a distributed parameter diode, and its cathode is connected with the earth.

For the purpose of cultivating a better understanding on the present embodiment, an example of the semiconductor switch and the switching circuits is introduced hereunder, and is explained in detail with reference to the drawings.

In the present example, the area of the anode electrode 7 was set to 10×400 µm, and the distance between the cathode electrode 8 and the anode electrode 7 was set to 3 µm. In addition, the first input-output terminal 1 and the second input-output terminal 2 are respectively connected with both the ends of the anode electrode 7, and further, 50 Ω loads are respectively connected with the first input-output terminal 1 and the second input-output terminal 2. Incidentally, capacitance with zero bias between the cathode and the anode is 20 fF per 100 µm, and on the other hand, resistance with forward bias is 4 Ω per 100 µm. In addition, entire length of the coplanar line is 400 µm.

In the semiconductor switch according to the present example comprising such configuration, positive voltage (2 V for the present example), and zero bias are supplied to the anode so as to alternate the states of the switch. That is, when positive voltage is applied to the anode of the semiconductor switch according to the present example, forward bias is to be given to the diode, an equivalent circuit of which is expressed by resistance, thus the switch can be regarded as a coplanar line with loss in shunt due to conductance. That is, at this time, the switch enters the OFF state. On the other hand, when zero bias was supplied to the anode of the semiconductor switch according to the present example, an equivalent circuit of the diode is expressed by capacitance, thus the switch is equivalent to a coplanar line without loss. Accordingly, the switch enters the ON state.

Figure 10:
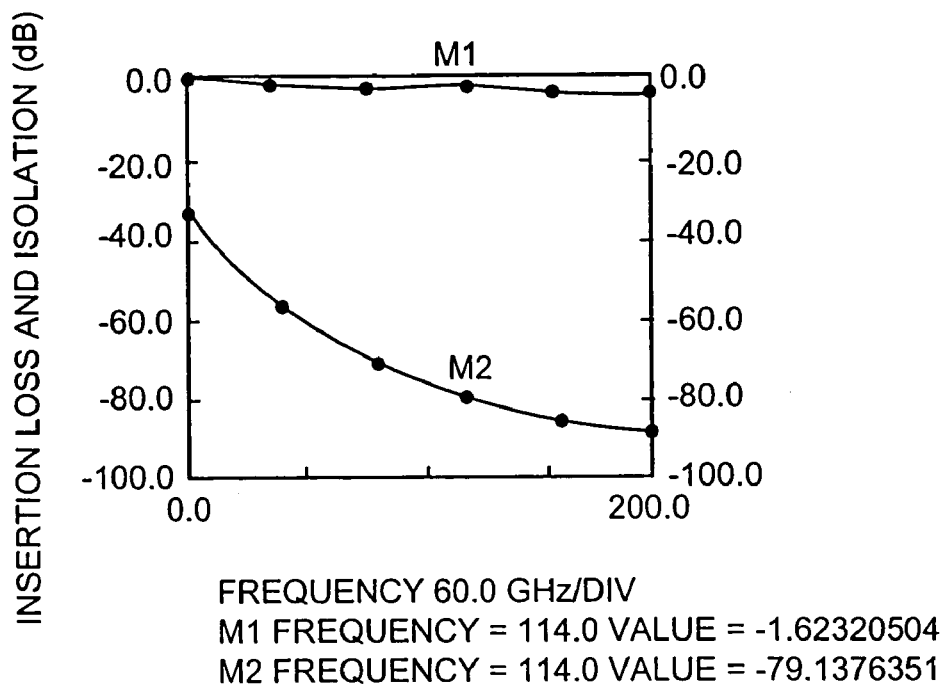
FIG. 10 is a graph showing frequency characteristics on insertion loss as well as isolation of the semiconductor switch according to one example in correspondence with the third embodiment of the present invention.

Frequency characteristics on insertion loss as well as isolation of the semiconductor switch according to the present example are shown in FIG. 10. As understandable with reference to FIG. 10, both of insertion loss and isolation show the same wide band width characteristics as in two examples respectively in correspondence with the aforementioned first and second embodiments. In addition, insertion loss at 114.0 GHz is 1.6 dB, and isolation is 79 dB. That is, it can be easily understood that the semiconductor switch according to the present example is the one which has realized high isolation of around 80 dB, maintaining low insertion loss, which was conventionally hardly successful in realizing in high frequencies not less than 60 GHz.

Figure 11:
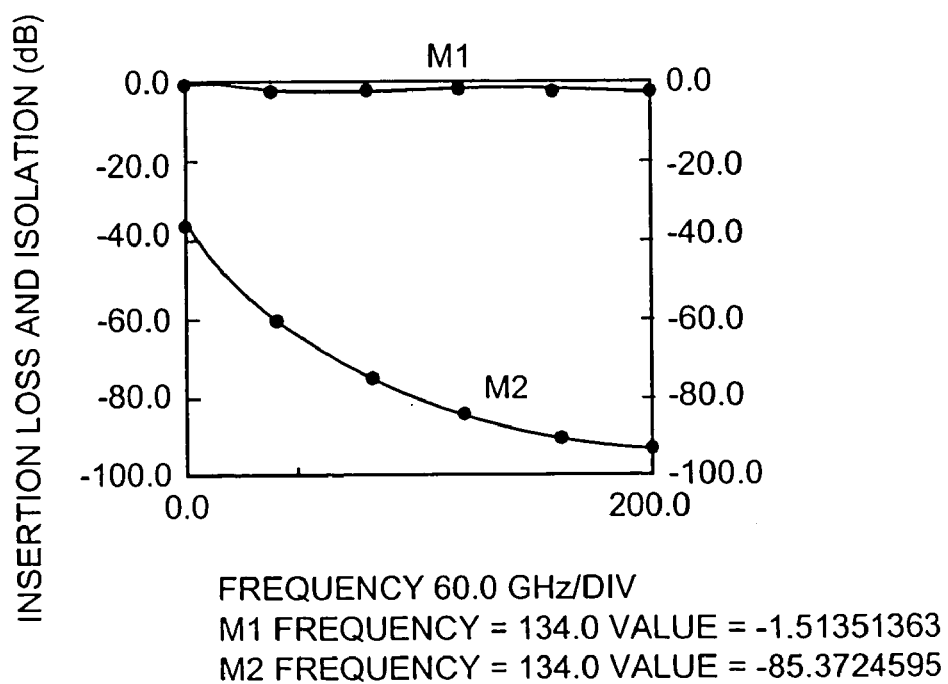
FIG. 11 is a graph showing frequency characteristics on insertion loss as well as isolation of the semiconductor switch according to another example in correspondence with the third embodiment of the present invention.
Figure 12:
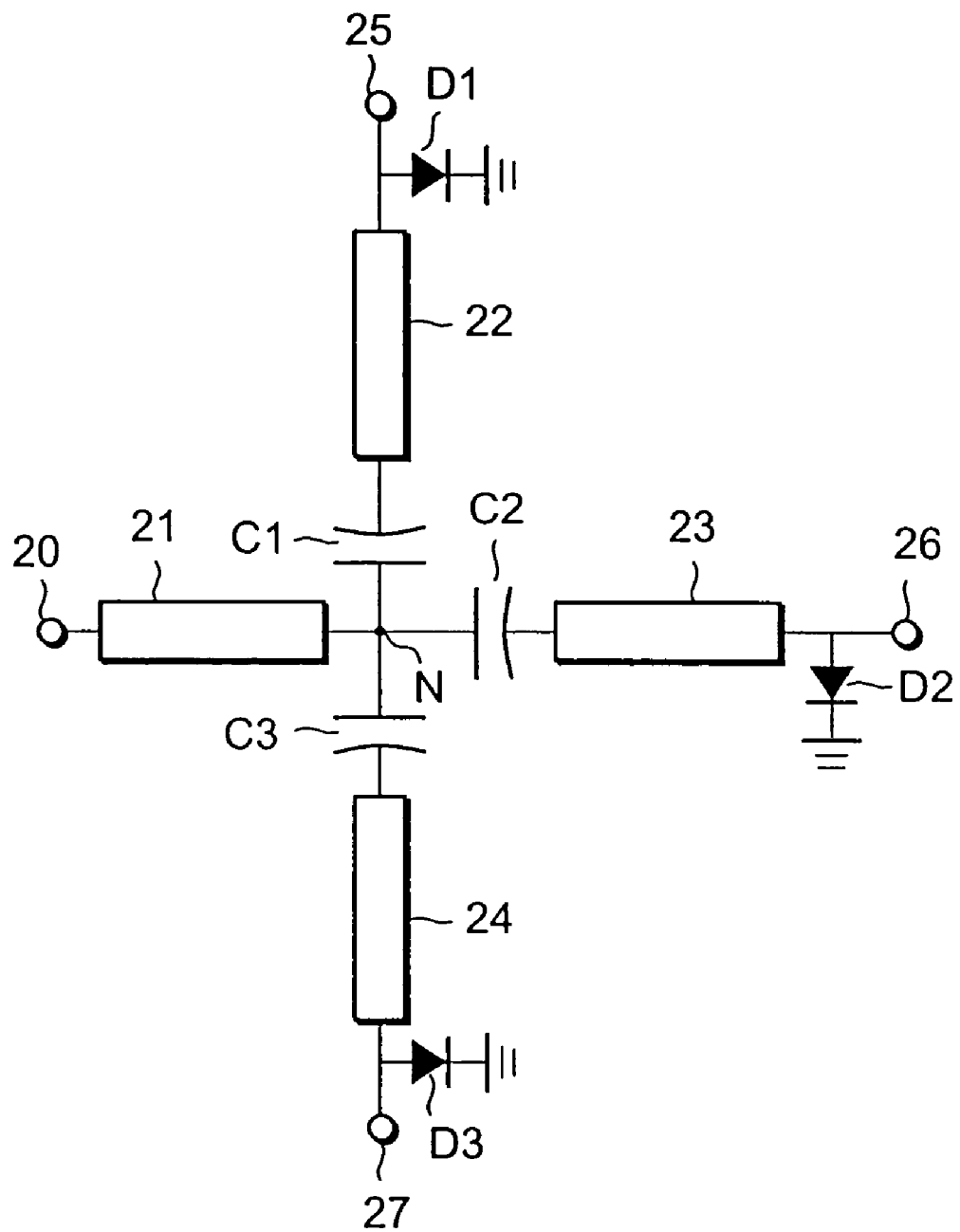
FIG. 12 is a circuit diagram showing an SP3T switch of Conventional example 1.
Figure 13:
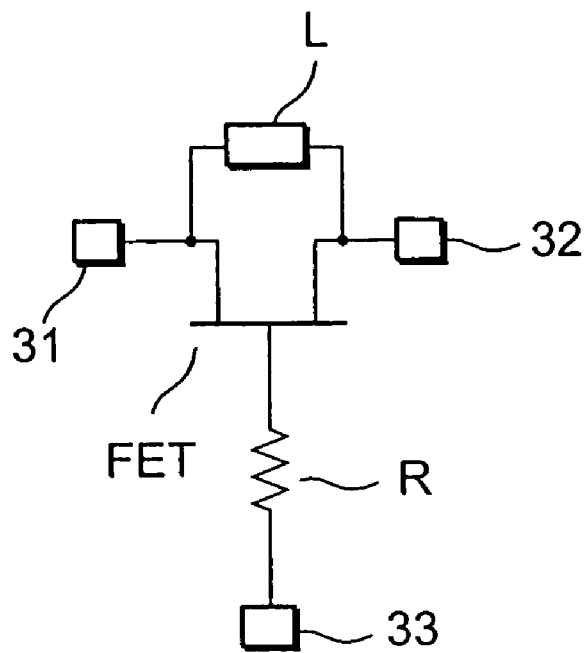
FIG. 13 is a circuit diagram showing an SPST switch of Conventional example 2.
Figure 14:
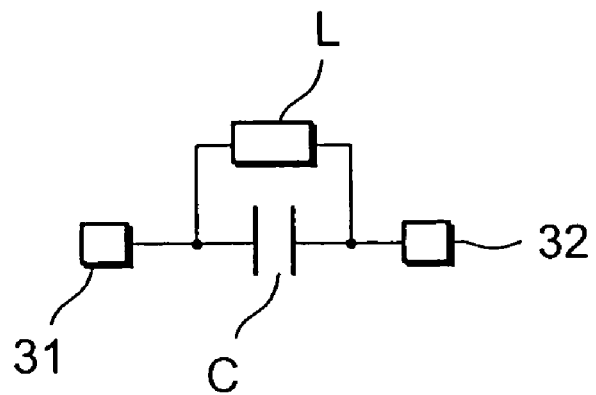
FIG. 14 is an equivalent circuit diagram showing an OFF state SPST switch of Conventional example 2.
Figure 15:
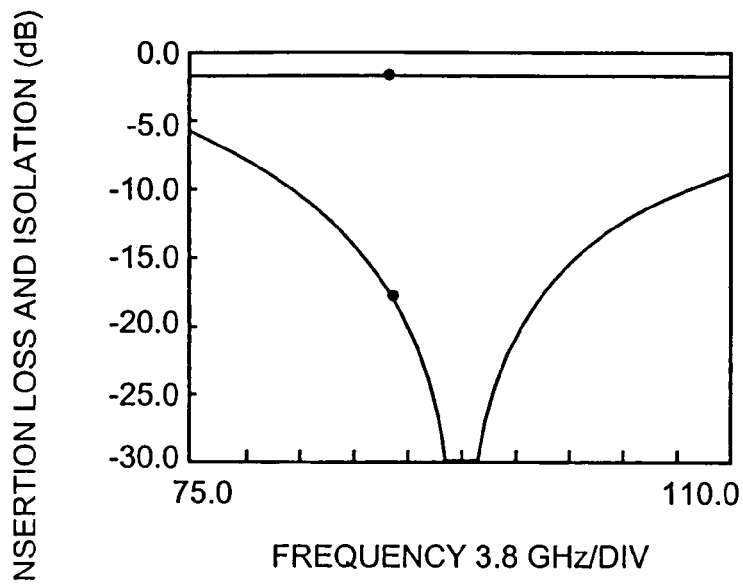
FIG. 15 is a graph showing frequency characteristics on insertion loss as well as isolation of the SPST switch of Conventinal example 2.
Figure 16:
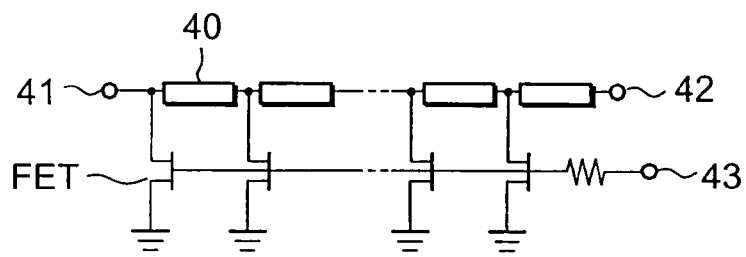
FIG. 16 is an equivalent circuit diagram showing an SPST switch of Conventional example 3.
Figure 17:
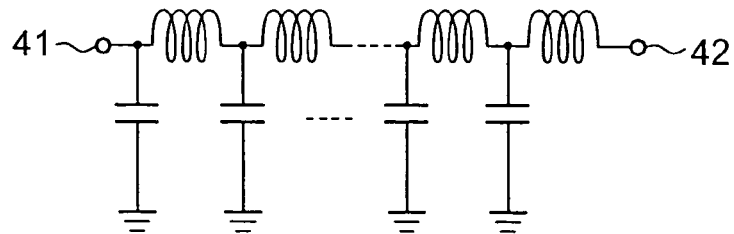
FIG. 17 is an equivalent circuit diagram showing an ON state SPST switch of Conventional example 3.
Figure 18:
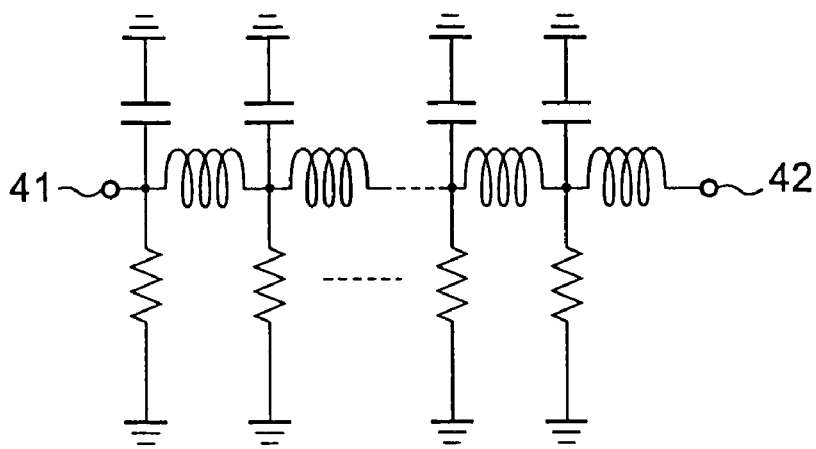
FIG. 18 is an equivalent circuit diagram showing an OFF state SPST switch of Conventional example 3.
Figure 19:
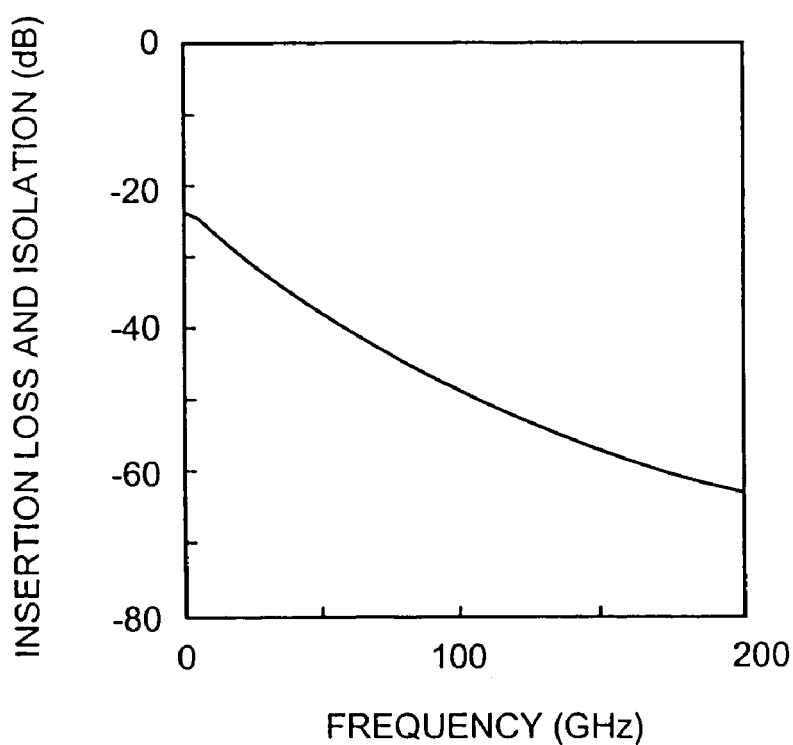
FIG. 19 is a graph showing frequency characteristics on insertion loss as well as isolation of the SPST switch of Conventinal example 3.

FIG. 11 is a graph showing frequency characteristics on insertion loss as well as isolation of the semiconductor switch according to the other example in correspondence with the third embodiment. In the present example, the area of the anode electrode 7 was set to 10×400 vm, and the distance between the cathode electrode 8 and the anode electrode 7 was set to 2.5 μm. In addition, the first input-output terminal 1 and the second input-output terminal 2 are respectively connected with both the ends of the anode electrode 7, and further, 50 Ω loads are respectively connected with the first input-output terminal 1 and the second input-output terminal 2. Capacitance with zero bias between the cathode and the anode is 20 fF per 100 μm, and on the other hand, resistance with forward bias is 3.3 Ω per 100 μm. In addition, entire length of the coplanar line is 400 μm.

In the semiconductor switch according to the present example comprising such configuration, unlike the foregoing example, the case where alternation of ON and OFF of the switch is conducted by way of applying both positive and negative electric power to the anode is examined. For example, the switch enters the OFF state with application of 2 V, and the switch enters the ON state with application of −5 V. As understandable with reference to FIG. 11, both of insertion loss and isolation show the same wide band width characteristics as in the above-described three examples. In addition, insertion loss at 134.0 GHz is 1.5 dB, and isolation is 85 dB. That is, it can be easily understood that the semiconductor switch according to the present example is also the one which has realized high isolation of not less than 80 dB, maintaining low insertion loss, which was conventionally hardly successful in realizing in high frequencies not less than 60 GHz.

Incidentally, in each of the above-exemplified examples, it has been explained that entire length of the coplanar line is 400 μm, which is of course a mere example, and it goes without saying that the length is not limited to the 400 μm. This length is one of design parameters to attain necessary insertion loss as well as isolation. In addition, it goes without saying that the present invention is applicable to transmission lines in general without being limited to coplanar lines.

As explained above, according to the present invention, high isolation of not less than 80 dB is attainable, maintaining low insertion loss also in high frequencies not less than 60 GHz. This effect is originated in usage of low-value resistance in the amount of, for example, approximately a half of that for switches using the resistance between the source and the drain in a conventional FET having distributed parameter effect. Perhaps, that is because the distances between the anode and cathode in a diode, and between the gate and the drain as well as between the gate and the source in an FET can be set shorter than the distance between the source and the drain in the FET.

Moreover, the above-described first and third embodiments use only positive electric power to control the switch and do not need to comprise negative power supply circuits, which point can be referred to as effective.

What is claimed is:

1. A semiconductor switch, comprising:
    an i-GaAs layer;
    a first i-AlGaAs layer formed on said first i-GaAs layer;
    an i-InGaAs layer formed on said i-AlGaAs layer;
    a n-AlGaAs layer formed on said i-InGaAs layer;
    a first anode electrode of a diode formed on said n-AlGaAs layer and supplied with a ground potential;
    a second anode electrode of a diode formed on said n-AlGaAs layer and supplied with said ground potential;
    an $n^+$GaAs layer formed between said first and second anodes on said n-AlGaAs layer; and
    a cathode electrode of a diode formed on said $n^+$GaAs layer and having a first end coupled to a first terminal and a second end coupled to a second terminal.

2. The switch as claimed in claim 1, wherein said diode acts as capacitance when said ground potential is applied to said cathode electrode thereby said switch being rendered in ON state.

3. The switch as claimed in claim 2, further comprising:
    a resistor having a first end connected to said cathode electrode and a second end supplied with said ground potential.

4. The switch as claimed in claim 1, wherein each of said cathode electrode and first and second anode electrodes are a metal layer.

5. The switch as claimed in claim 4, wherein said first anode electrode is provided to have a Schottoky junction with said active region.

6. The switch as claimed in claim 5, wherein said cathode electrode is provided to have an ohmic junction with said active region.

7. The switch as claimed in claim 6, wherein said switch is arranged to use for microwave or millimeter wave.

8. The switch as claimed in claim 1, further comprising a switching circuit, said switching circuit comprising:
    a first coplanar transmission line having a first signal line and a first pair of conductors arranged so that said first signal line is sandwiched between said first pair of conductors, said first pair of conductors being applied to the ground potential;
    a second coplanar transmission line having a second signal line and a second pair of conductors arranged so that said signal line is sandwiched between said second pair of conductors, said second pair of conductors being applied to the ground potential; and
    a diode coupled to a signal line coupling said first signal line of said first coplanar transmission line and said second signal line of said second coplanar transmission line, a cathode of the diode being coupled to said signal line and an anode of the diode being coupled to the ground potential.

9. The switch as claimed in claim 8, wherein said cathode is supplied with a negative voltage so that the switching circuit is to be in an off state and is supplied with a zero bias so that the switching circuit is to be in an on state.

10. The switch as claimed in claim 9, wherein said switch is arranged to use for microwave or millimeter wave.

* * * * *